US012667003B2

(12) United States Patent
Sun

(10) Patent No.: US 12,667,003 B2
(45) Date of Patent: Jun. 23, 2026

(54) LIGHT-EMITTING PANEL, METHOD FOR FABRICATING SAME, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Bo Sun, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 810 days.

(21) Appl. No.: 17/795,524

(22) PCT Filed: Jul. 25, 2022

(86) PCT No.: PCT/CN2022/107642
§ 371 (c)(1),
(2) Date: Jul. 26, 2022

(87) PCT Pub. No.: WO2024/000706
PCT Pub. Date: Jan. 4, 2024

(65) Prior Publication Data
US 2024/0186297 A1      Jun. 6, 2024

(30) Foreign Application Priority Data

Jun. 29, 2022     (CN) .......................... 202210755299.6

(51) Int. Cl.
*H10W 90/00*        (2026.01)
*H10H 20/01*        (2025.01)
*H10H 20/855*       (2025.01)

(52) U.S. Cl.
CPC .......... *H10W 90/00* (2026.01); *H10H 20/855* (2025.01); *H10H 20/0363* (2025.01)

(58) Field of Classification Search
CPC ............. H10H 29/142; H10H 20/0363; H10H 20/0362; H10H 20/855; H10H 20/857;
(Continued)

(56) References Cited

U.S. PATENT DOCUMENTS

| | | | |
|---|---|---|---|
| 2021/0005488 A1 | 1/2021 | Chen et al. | |
| 2021/0384388 A1* | 12/2021 | Cha ...................... | H10H 29/142 |
| 2022/0077229 A1* | 3/2022 | Yu ........................ | H10H 20/857 |

FOREIGN PATENT DOCUMENTS

| | | |
|---|---|---|
| CN | 109004078 A | 12/2018 |
| CN | 112289909 A | 1/2021 |
| | (Continued) | |

OTHER PUBLICATIONS

PCT International Search Report for International Application No. PCT/CN2022/107642, mailed on Dec. 16, 2022, 8pp.
(Continued)

*Primary Examiner* — Leonard Chang
*Assistant Examiner* — Stanetta D Isaac
(74) *Attorney, Agent, or Firm* — The Roy Gross Law Firm, LLC; Roy D. Gross

(57) ABSTRACT

A light-emitting panel includes a substrate, a light-emitting element, and a package assembly. The package assembly includes a light-transmitting substrate and a light-shielding layer. The light-shielding layer includes a plurality of light-shielding portions arranged at intervals. The light-shielding portions are connected to the light-transmitting substrate. Two adjacent light-shielding portions and the light-transmitting substrate form an accommodation space. The light-
(Continued)

emitting element is located in the accommodating space. A light emitted by the light-emitting element pass through the package assembly.

18 Claims, 5 Drawing Sheets

(58) Field of Classification Search
CPC .... H10H 20/85; H10H 20/852; H10H 20/853;
H10H 20/856; H01L 25/0753
See application file for complete search history.

(56) References Cited

FOREIGN PATENT DOCUMENTS

| | | | |
|---|---|---|---|
| CN | 112786742 A | 5/2021 |
| CN | 113471238 A | 10/2021 |
| CN | 113488501 A | 10/2021 |
| CN | 113782552 A | 12/2021 |
| CN | 114334925 A | 4/2022 |
| CN | 114566495 A | 5/2022 |

OTHER PUBLICATIONS

PCT Written Opinion of the International Search Authority for International Application No. PCT/CN2022/107642, mailed on Dec. 16, 2022, 7pp.
Chinese Office Action issued in corresponding Chinese Patent Application No. 202210755299.6 dated May 25, 2025, pp. 1-8, 17pp.

* cited by examiner

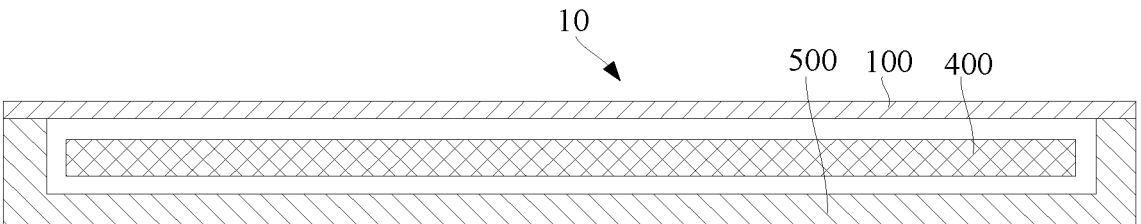

FIG. 5

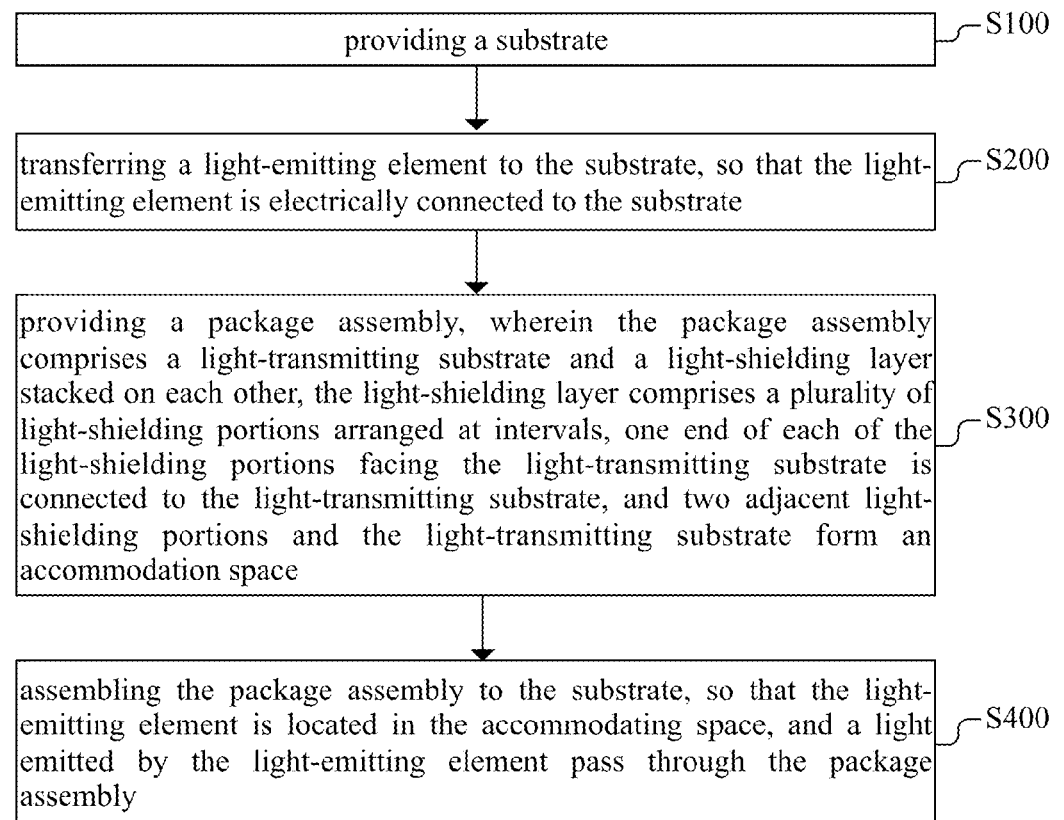

| providing a substrate | ⌐S100 |

| transferring a light-emitting element to the substrate, so that the light-emitting element is electrically connected to the substrate | ⌐S200 |

| providing a package assembly, wherein the package assembly comprises a light-transmitting substrate and a light-shielding layer stacked on each other, the light-shielding layer comprises a plurality of light-shielding portions arranged at intervals, one end of each of the light-shielding portions facing the light-transmitting substrate is connected to the light-transmitting substrate, and two adjacent light-shielding portions and the light-transmitting substrate form an accommodation space | ⌐S300 |

| assembling the package assembly to the substrate, so that the light-emitting element is located in the accommodating space, and a light emitted by the light-emitting element pass through the package assembly | ⌐S400 |

FIG. 6

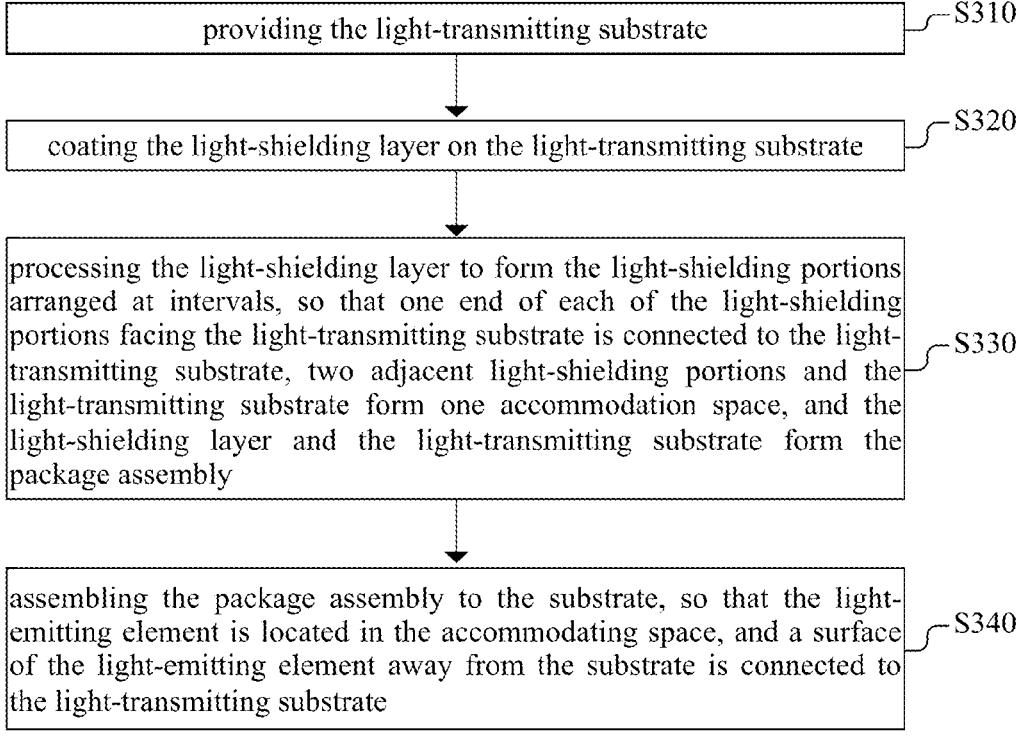

providing the light-transmitting substrate    S310 coating the light-shielding layer on the light-transmitting substrate    S320 processing the light-shielding layer to form the light-shielding portions arranged at intervals, so that one end of each of the light-shielding portions facing the light-transmitting substrate is connected to the light-transmitting substrate, two adjacent light-shielding portions and the light-transmitting substrate form one accommodation space, and the light-shielding layer and the light-transmitting substrate form the package assembly    S330 assembling the package assembly to the substrate, so that the light-emitting element is located in the accommodating space, and a surface of the light-emitting element away from the substrate is connected to the light-transmitting substrate    S340

FIG. 7

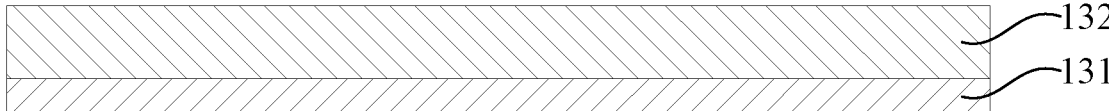

LIGHT-EMITTING PANEL, METHOD FOR FABRICATING SAME, AND DISPLAY DEVICE

This application is a National Phase of PCT Patent Application No. PCT/CN2022/107642 having International filing date of Jul. 25, 2022, which claims the benefit of Chinese Patent Application No. 202210755299.6, filed Jun. 29, 2022, the contents of which are all incorporated herein by reference in their entirety.

FIELD OF INVENTION

The present disclosure relates to the technical field of display, and particularly to a light-emitting panel, a method for fabricating the same, and a display device.

BACKGROUND

In recent years, because Mini-LEDs have advantages of high brightness, good brightness uniformity, and wide color gamut, and high saturation, light-emitting panels using Mini-LEDs as light sources have gradually been favored by end consumers. However, Mini-LEDs may be abnormal or drift during a display process. In this case, it will involve problem analysis and repair of Mini-LEDs. After a light-emitting panel is packaged with a conventional package assembly and packaging method, it is impossible to inspect and repair Mini-LEDs while ensuring a light-extraction rate of the light-emitting panel.

SUMMARY OF DISCLOSURE

The present disclosure provides a light-emitting panel, a method for fabricating the same, and a display device, which can solve the problem that Mini-LEDs cannot be inspected and repaired while ensuring a light-extraction rate after a current light-emitting panel is packaged.

The present disclosure provides a light-emitting panel, comprising:

a substrate;

a light-emitting element disposed on the substrate and electrically connected to the substrate; and a package assembly disposed on the substrate and comprising a light-transmitting substrate and a light-shielding layer stacked on each other, wherein the light-shielding layer is located between the light-transmitting substrate and the substrate and comprises a plurality of light-shielding portions arranged at intervals, one end of each of the light-shielding portions away from the substrate is connected to the light-transmitting substrate, two adjacent light-shielding portions and the light-transmitting substrate form an accommodation space, and the light-emitting element is located in the accommodating space, so that a light emitted by the light-emitting element pass through the package assembly.

In some embodiments, a surface of the light-emitting element away from the substrate is connected to the light-transmitting substrate.

In some embodiments, the light-shielding layer further comprises a plurality of connecting portions each connected between two adjacent light-shielding portions. A surface of each of the connecting portions facing the light-transmitting substrate is connected to the light-transmitting substrate. One accommodating space is formed by two adjacent light-shielding portions and one corresponding connecting portion. A surface of the light-emitting element away from the substrate is connected to the connecting portion.

In some embodiments, the light-emitting panel further comprises a plurality of light-emitting units. Each of the light-emitting units comprises a plurality of the light-emitting elements. The light-shielding portions comprise a first light-shielding sub-portion. One end of the first light-shielding sub-portion away from the substrate is connected to the light-transmitting substrate, and the first light-shielding sub-portion is disposed around each of the light-emitting units.

In some embodiments, the light-shielding portions comprise a plurality of second light-shielding sub-portions. One end of each of the second light-shielding sub-portions away from the substrate is connected to the light-transmitting substrate, and each of the second light-shielding sub-portions is disposed between two adjacent light-emitting elements in one light-emitting unit.

In some embodiments, two ends of each of the second light-shielding sub-portions between two adjacent light-emitting elements in one light-emitting unit are respectively connected with two parts of the first light-shielding sub-portion located on opposite sides of the corresponding light-emitting unit.

In some embodiments, a thickness of the first light-shielding sub-portion is greater than or equal to a thickness of the second light-shielding sub-portions, the thickness of the first light-shielding sub-portion is less than or equal to 100 microns, and the thickness of the second light-shielding sub-portions is less than or equal to 100 microns.

In some embodiments, a surface of the first light-shielding sub-portion away from the light-transmitting substrate is in contact with the substrate.

In some embodiments, a surface of the first light-shielding sub-portion away from the light-transmitting substrate is in contact with the substrate, and a surface of each of the second light-shielding sub-portions away from the light-transmitting substrate is in contact with the substrate.

In some embodiments, there is a first gap between the first light-shielding sub-portion and the adjacent light-emitting unit.

In some embodiments, there is a second gap between each of the second light-shielding sub-portions and the adjacent light-emitting element.

In some embodiments, the package assembly comprises a plurality of the light-transmitting substrates stacked on each other, and two adjacent light-transmitting substrates have different refractive indices.

In some embodiments, the light-transmitting substrates have different refractive indices.

In some embodiments, the refractive indices of the light-transmitting substrates increase sequentially in the direction away from the light-shielding layer.

In some embodiments, the refractive indices of the light-transmitting substrates decrease sequentially in the direction away from the light-shielding layer.

The present disclosure further provides a display device comprising any one of the light-emitting panels described above.

The present disclosure further provides a method for fabricating a light-emitting panel, comprising:

providing a substrate;

transferring a light-emitting element to the substrate, so that the light-emitting element is electrically connected to the substrate;

providing a package assembly, wherein the package assembly comprises a light-transmitting substrate and a light-shielding layer stacked on each other, the light-shielding layer comprises a plurality of light-shielding portions arranged at intervals, one end of each of the light-shielding portions facing the light-transmitting substrate is connected to the light-transmitting substrate, and two adjacent light-shielding portions and the light-transmitting substrate form an accommodation space; and assembling the package assembly to the substrate, so that the light-emitting element is located in the accommodating space, and a light emitted by the light-emitting element pass through the package assembly.

In some embodiments, the providing the package assembly and the assembling the package assembly to the substrate comprise:

providing the light-transmitting substrate;

coating the light-shielding layer on the light-transmitting substrate;

processing the light-shielding layer to form the light-shielding portions arranged at intervals, so that one end of each of the light-shielding portions facing the light-transmitting substrate is connected to the light-transmitting substrate, two adjacent light-shielding portions and the light-transmitting substrate form one accommodation space, and the light-shielding layer and the light-transmitting substrate form the package assembly; and assembling the package assembly to the substrate, so that the light-emitting element is located in the accommodating space, and a surface of the light-emitting element away from the substrate is connected to the light-transmitting substrate.

In some embodiments, the providing the package assembly and the assembling the package assembly to the substrate comprise:

providing the light-transmitting substrate;

coating the light-shielding layer on the light-transmitting substrate;

processing the light-shielding layer to form the light-shielding portions arranged at intervals and a plurality of connecting portions each connected between two adjacent light-shielding portions, so that one end of each of the light-shielding portions facing the light-transmitting substrate is connected to the light-transmitting substrate, a surface of each of the connecting portions facing the light-transmitting substrate is connected to the light-transmitting substrate, one accommodating space is formed by two adjacent light-shielding portions and one corresponding connecting portion, and the light-shielding layer and the light-transmitting substrate form the package assembly; and assembling the package assembly to the substrate, so that the light-emitting element is located in the accommodating space, and a surface of the light-emitting element away from the substrate is connected to the connecting portion.

In some embodiments, the light-emitting panel comprises a plurality of light-emitting units, each of the light-emitting units comprises a plurality of the light-emitting elements, the light-shielding portions comprise a first light-shielding sub-portion and a plurality of second light-shielding sub-portions, and the assembling the package assembly to the substrate comprise:

assembling the package assembly to the substrate, so that the first light-shielding sub-portion is located between two adjacent light-emitting units, and each of the second light-shielding sub-portions is disposed between two adjacent light-emitting elements in one light-emitting unit.

In the present disclosure, a light-emitting panel comprises a substrate, a light-emitting element, and a package assembly. The light-emitting element is disposed on the substrate and is electrically connected to the substrate. The package assembly is disposed on the substrate and comprises a light-transmitting substrate and a light-shielding layer stacked on each other. The light-shielding layer is located between the light-transmitting substrate and the substrate and comprises a plurality of light-shielding portions arranged at intervals. One end of each of the light-shielding portions away from the substrate is connected to the light-transmitting substrate. Two adjacent light-shielding portions and the light-transmitting substrate form an accommodation space. The light-emitting element is located in the accommodating space, so that a light emitted by the light-emitting element pass through the package assembly. In the present disclosure, an entirety of the package assembly is assembled to the substrate to package the light-emitting element. When the light-emitting element fails, the package assembly can be directly opened to facilitate inspection and repair of the light-emitting element. Furthermore, by disposing the light-emitting element in the accommodating space formed by the light-shielding portions and the light-transmitting substrate, a thickness of a part of the light-shielding layer on a surface of the light-emitting element can also be reduced to improve a light-extraction rate of the light-emitting panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

FIG. 5 is a schematic structural diagram of another display device according to an embodiment of the present disclosure.

FIG. 6 is a flowchart of a method for fabricating a light-emitting panel according to an embodiment of the present disclosure.

FIG. 7 is a flowchart of step S300 of FIG. 6 according to an embodiment of the present disclosure.

FIG. 8 is a schematic structural diagram of step S320 of FIG. 7 according to an embodiment of the present disclosure.

Figure 1:
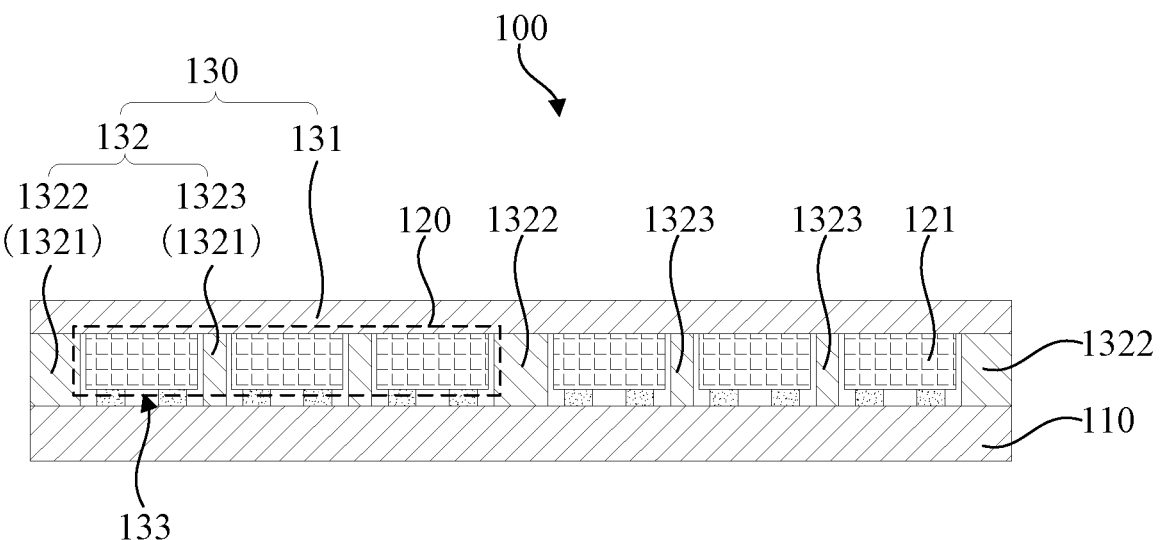
FIG. 1 is a schematic structural diagram of a light-emitting panel according to an embodiment of the present disclosure.

The accompanying drawings have the following reference numerals:

| reference numeral | Component name |
| --- | --- |
| 10 | display device |
| 100 | light-emitting panel |
| 110 | substrate |
| 120 | light-emitting unit |
| 121 | light-emitting element |
| 130 | package assembly |
| 131 | light-transmitting substrate |
| 132 | light-shielding layer |
| 1321 | light-shielding portion |
| 1322 | first light-shielding sub-portion |
| 1323 | The second light-shielding sub-portion |
| 1324 | connecting portion |
| 133 | accommodation space |
| 200 | backlight module |
| 210 | backplane |
| 220 | optical film set |
| 300 | display panel |
| 400 | control circuit |
| 500 | housing |

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

The present disclosure provides a light-emitting panel, a method for fabricating the same, and a display device, which will be respectively described in detail below. It should be noted that a description order of the following embodiments is not intended to limit a preferred order of the embodiments.

Figure 2:
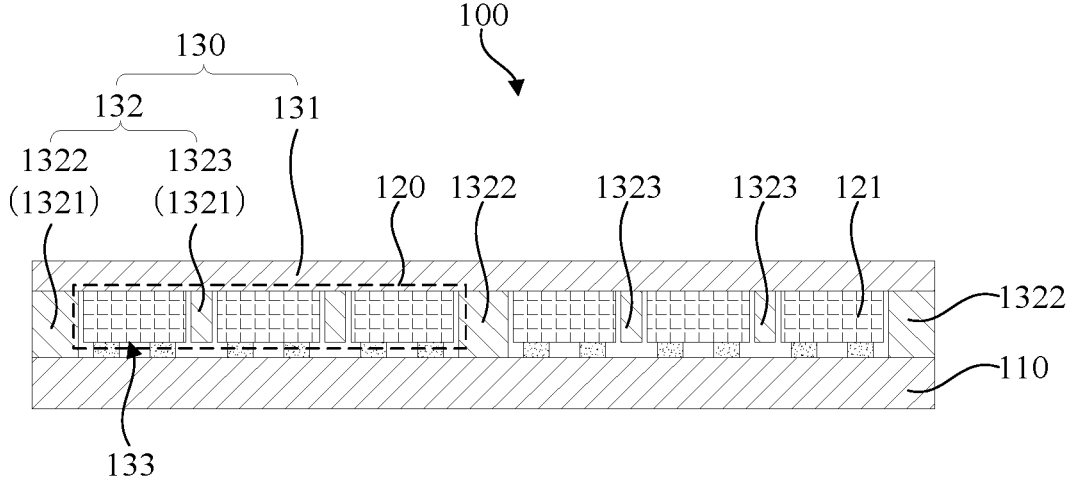
FIG. 2 is a schematic structural diagram of another light-emitting panel according to an embodiment of the present disclosure.
Figure 3:
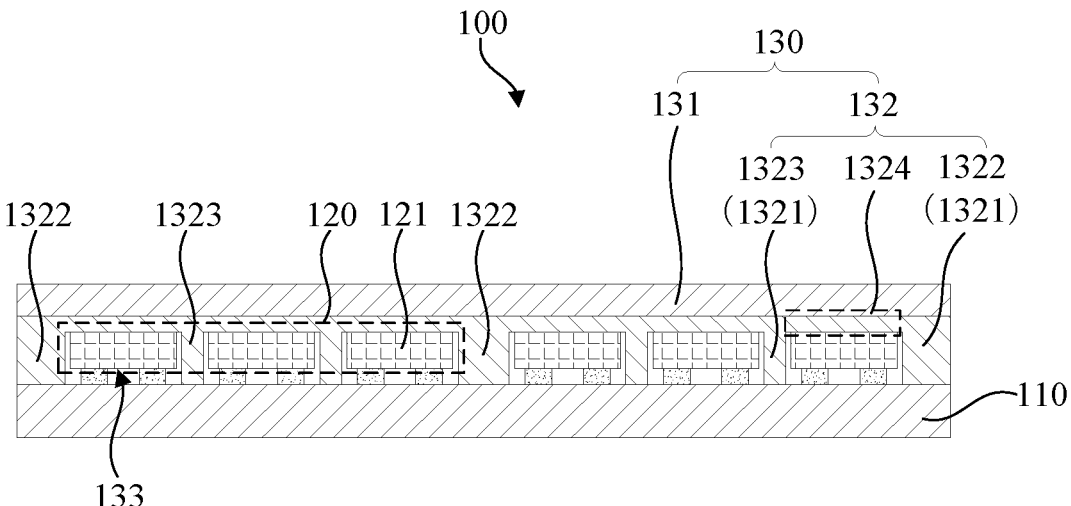
FIG. 3 is a schematic structural diagram of yet another light-emitting panel according to an embodiment of the present disclosure.

First, the present disclosure provides a light-emitting panel. As shown in FIG. 1 to FIG. 3, a light-emitting panel 100 comprises a substrate 110. The substrate 110 is configured as a supporting structure of the light-emitting panel 100 to support other structures in the light-emitting panel 100, so as to ensure a structural stability of the light-emitting panel 100. The substrate 110 is provided with a control device and a driving circuit to control other structures subsequently disposed on the substrate 110, so as to regulate a light-emitting effect of the light-emitting panel 100.

The light-emitting panel 100 further comprises a light-emitting element 121. The light-emitting element 121 is disposed on the substrate 110 and is electrically connected to the substrate 110. When the light-emitting panel 100 is in operation, the control device is turned on by inputting a control signal into the driving circuit, and then the control signal is input to the light-emitting element 121 to control the light-emitting element 121 to emit light and display.

The light-emitting panel 100 further comprises a package assembly 130. The package assembly 130 is disposed on the substrate 110. The package assembly 130 is disposed on the substrate 110 to package the light-emitting element 121. This can prevent a situation that the light-emitting element 121 is damaged by external environment or sundries, which causes the light-emitting element 121 to fail to display normally, thereby affecting an overall display effect of the light-emitting panel 100.

The package assembly 130 comprises a light-transmitting substrate 131 and a light-shielding layer 132 stacked on each other, and the light-shielding layer 132 is located between the light-transmitting substrate 131 and the substrate 110. The light-shielding layer 132 is configured to shield an ambient light reflected by a non-display area of the substrate 110, so as to prevent the reflected ambient light from interfering with a light emitted from the light-emitting panel 100 and affecting the light-emitting effect of the light-emitting panel 100. The light-transmitting substrate 131 is configured to allow a light emitted by the light-emitting element 121 to pass through the package assembly 130, so as to ensure a light-extraction rate of the light-emitting panel 100.

The light-shielding layer 132 comprises a plurality of light-shielding portions 1321 arranged at intervals. One end of each of the light-shielding portions 1321 away from the substrate 110 is connected to the light-transmitting substrate 131. That is, the light-shielding portions 1321 and the light-transmitting substrate 131 are connected as a whole. Two adjacent light-shielding portions 1321 and the light-transmitting substrate 131 form an accommodation space 133. The light-emitting element 121 is located in the accommodating space 133, so that the light emitted by the light-emitting element 121 pass through the package assembly 130. That is, an entirety of the package assembly 130 is assembled to the substrate 110, so that the light-emitting element 121 is located in the accommodation space 133 formed by the light-shielding portions 1321 and the light-transmitting substrate 131, so as to realize packaging of the light-emitting element 121. In this way, when the light emitting element 121 fails, the entirety of the package assembly 130 can be uncovered to expose the light emitting element 121, so as to facilitate inspection and repair of the light emitting element 121, thereby ensuring continued use of the light emitting panel 100.

In addition, by disposing the light-emitting element 121 in the accommodating space 133 formed by the light-shielding portions 1321 and the light-transmitting substrate 131, a thickness of a part of the light-shielding layer 132 corresponding to a light-emitting surface of the light-emitting element 121 is less than thicknesses of other parts of the light-shielding layer 132. Therefore, more light emitted by the light emitting element 121 can pass through the package assembly 130, so as to improve the light-extraction rate of the light emitting panel 100.

In an embodiment of the present disclosure, a light-emitting panel 100 comprises a substrate 110, a light-emitting element 121, and a package assembly 130. The light-emitting element 121 is disposed on the substrate 110 and is electrically connected to the substrate 110. The package assembly 130 is disposed on the substrate 110. The package assembly 130 comprises a light-transmitting substrate 131 and a light-shielding layer 132 stacked on each other. The light-shielding layer 132 comprises a plurality of light-shielding portions 1321 arranged at intervals. One end of each of the light-shielding portions 1321 away from the substrate 110 is connected to the light-transmitting substrate 131. Two adjacent light-shielding portions 1321 and the light-transmitting substrate 131 form one accommodation space 133. The light-emitting element 121 is located in the accommodating space 133, so that a light emitted by the light-emitting element 121 pass through the package assembly 130. In the present disclosure, an entirety of the package assembly 130 is assembled to the substrate 110 to package the light-emitting element 121. When the light-emitting element 121 fails, the package assembly 130 can be directly opened to facilitate inspection and repair of the light-emitting element 121. Furthermore, by disposing the light-emitting element 121 in the accommodating space 133 formed by the light-shielding portions 1321 and the light-transmitting substrate 131, a thickness of a part of the light-shielding layer 132 on a surface of the light-emitting element 121 can also be reduced to improve a light-extraction rate of the light-emitting panel 110.

Optionally, as shown in FIG. 1 and FIG. 2, a surface of the light-emitting element 121 away from the substrate 110 is connected to the light-transmitting substrate 131. That is, an exposed part of the light-transmitting substrate 131 is directly attached to the surface of the light-emitting element 121 away from the substrate 110, so that the light emitted by the light-emitting element 121 can pass through the light-transmitting substrate 131. In this structural design, the surface of the light-emitting element 121 away from the substrate 110 is only covered with the light-transmitting substrate 131, so as to further improve the light-extraction rate of the light-emitting panel 100.

In some embodiments, as shown in FIG. 3, the light-shielding layer 132 further comprises a plurality of connecting portions 1324 each connected between two adjacent light-shielding portions 1321. A surface of each of the connecting portions 1324 facing the light-transmitting substrate 131 is connected to the light-transmitting substrate 131. The accommodating space 133 is formed by two adjacent light-shielding portions 1321 and one corresponding connecting portion 1324. The light-emitting element 121 is located in the accommodating space 133, and the surface of the light-emitting element 121 away from the substrate 110 is connected to the connecting portion 1324. That is, the light-shielding layer 132 is disposed on an entire surface of the light-transmitting substrate 131, and a thickness of the connecting portion 1324 corresponding to the light-emitting element 121 is less than the thicknesses of the other parts of the light-shielding layer 132. This structural design can ensure structural integrity of the light shielding layer 132 while ensuring that an entirety of the light-emitting panel 100 has a certain light-extraction rate.

When the package assembly 130 and the light-emitting element 121 are assembled by bonding, a surface of the connecting portion 1324 away from the light-transmitting substrate 131 is bonded to the surface of the light-emitting element 121 away from the substrate 110, and a surface of the light shielding portion 1321 away from the light-transmitting substrate 131 is bonded to the substrate 110, so as to improve stability between the package assembly 130 and the substrate 110. At this time, one connecting portion 1324 is connected between two adjacent light-shielding portions 1321, so that each area of the light-shielding layer 132 can interact with each other when the package assembly 130 is uncovered. This reduces a risk that parts of the light-shielding portions 1321 are left on the substrate 110 due to an excessive bonding strength between the light-shielding layer 132 and the substrate 110, thereby improving a structural stability of the package assembly 130. A thickness of the connecting portions 1324 may be adjusted according to actual application requirements, so as to meet design requirements of the light-emitting panel 100 with different light-extraction rates.

It should be noted that the light-shielding layer 132 may be made of a black oil or other light-shielding materials with a certain light-shielding effect. A light-shielding effect of the light-shielding layer 132 may be adjusted according to a thickness of the light-shielding layer 132, so as to meet design requirements of the light-shielding layer 132 with different structures.

Optionally, the light-emitting panel 100 further comprises a plurality of light-emitting units 120. Each of the light-emitting units 120 comprises a plurality of the light-emitting elements 121. The light-shielding portions 1321 comprise a first light-shielding sub-portion 1322. One end of the first light-shielding sub-portion 1322 away from the substrate 110 is connected to the light-transmitting substrate 131. The first light-shielding sub-portion 1322 is disposed between at least two adjacent light-emitting units 120. That is, in addition to shielding an ambient light reflected by a non-display region between two adjacent light-emitting units 120, the first light-shielding sub-portion 1322 can also prevent lights emitted by the two adjacent light-emitting units 120 from interfering with each other or mixing light, thereby avoiding affecting the light-emitting effect of the light-emitting panel 100.

In some embodiments, the first light-shielding sub-portion 1322 is disposed between any two adjacent light-emitting units 120. When the light-emitting units 120 are arranged in an array, one strip-shaped first light-shielding sub-portion 1322 is disposed between two adjacent rows of the light-emitting units 120, and one strip-shaped first light-shielding sub-portion 1322 is also disposed between two adjacent columns of the light-emitting units 120. That is, the first light-shielding sub-portions 1322 are distributed among the light emitting units 120 in multiple rows and columns, which prevent lights emitted by any two light-emitting units 120 from interfering with each other or mixing light, thereby improving the light-emitting effect of the light-emitting panel 100.

In other embodiments, the first light-shielding sub-portion 1322 is disposed around each of the light-emitting units 120. That is, a periphery of each of the light-emitting units 120 is provided with the first light-shielding sub-portion 1322, so as to prevent mutual interference or light mixing on any side of the light-emitting unit 120. At this time, an entirety of the first light-shielding sub-portion 1322 has a closed grid structure. That is, a surface of the substrate 110 facing the light-emitting element 121 is shielded by the first light-shielding sub-portion 1322 except an area where the light-emitting unit 120 is located, thereby reducing reflection of ambient light by the substrate 110 and improving the light-emitting effect of the light-emitting panel 100.

Optionally, the light-shielding portions 1321 comprise a plurality of second light-shielding sub-portions 1323. One end of each of the second light-shielding sub-portions 1323 away from the substrate 110 is connected to the light-transmitting substrate 131. Each of the second light-shielding sub-portions 1323 is disposed between at least two adjacent light-emitting elements 121 in one light-emitting unit 120. That is, the second light-shielding sub-portions 1323 are disposed inside the light-emitting units 120 to avoid mutual interference of lights emitted by two adjacent light-emitting elements 121 in one light-emitting unit 120, thereby improving a light-emitting effect of one light-emitting unit 120 and improving the light-emitting effect of the light-emitting panel 100.

In other embodiments, each of the second light-shielding sub-portions 1323 is disposed between any two adjacent light-emitting elements 121 in one light-emitting unit 120. That is, each of the light-emitting elements 121 in one light-emitting unit 120 is surrounded by the first light-shielding sub-portion 1322 and the second light-shielding sub-portions 1323, so as to prevent lights emitted from sides of the light-emitting element 121 from interfering with each other and block an ambient light reflected by a region between two adjacent light-emitting elements 121, thereby further improving the light-emitting effect of the light-emitting panel 100.

Figure 10:
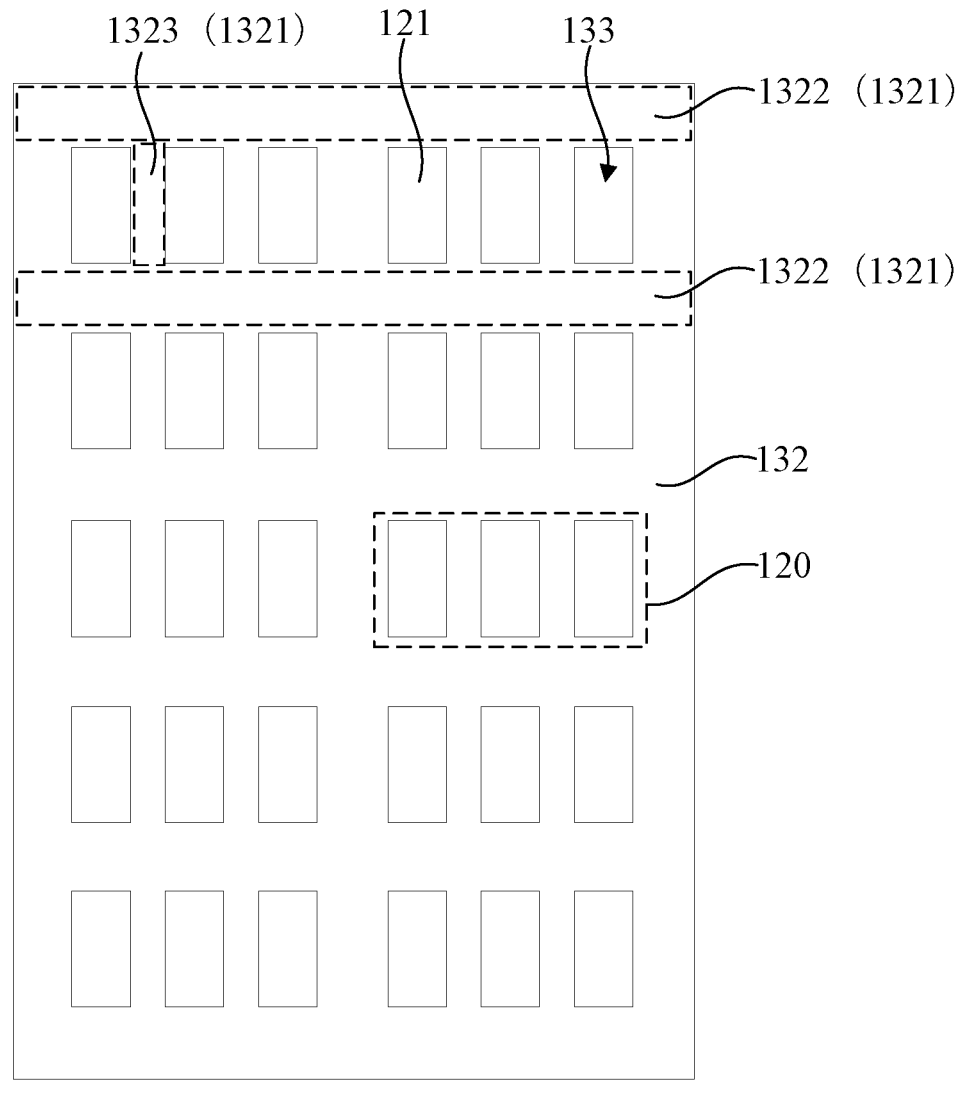
FIG. 10 is a top view of step S330 of FIG. 7 according to an embodiment of the present disclosure.

In a top view, as shown in FIG. 10, two ends of each of the second light-shielding sub-portions 1323 between two adjacent light-emitting elements 121 are respectively connected with two parts of the first light-shielding sub-portion 1322 located on opposite sides of the corresponding light-emitting unit 120. That is, the first light-shielding sub-portion 1322 and the second light-shielding sub-portions 1323 are an integral structure. Therefore, the surface of the substrate 110 facing the light-emitting element 121 is shielded by the first light-shielding sub-portion 1322 and the second light-shielding sub-portions 1323 except an area where the light-emitting element 121 is located, thereby minimizing the reflection of the ambient light by the substrate 110.

It should be noted that after the package assembly 130 and the light-emitting elements 121 are attached, the accommodating spaces 133 correspond to the light-emitting elements 121 to expose the corresponding light-emitting elements 121. That is, in a distribution direction of the light-emitting elements 121 in one light-emitting unit 120, a gap between two adjacent second light-shielding sub-portions 1323 forms one accommodation space 133, and a gap between the first light-shielding sub-portion 1322 and one adjacent second light-shielding sub-portion 1323 also forms one accommodation space 133.

Optionally, a thickness of the first light-shielding sub-portion 1322 is greater than or equal to a thickness of the second light-shielding sub-portions 1323. When the package assembly 130 is assembled to the substrate 110, a surface of the first light-shielding sub-portion 1322 and a surface of each of the second light-shielding sub-portions 1323 away from the light-transmitting substrate 131 may be attached to the substrate 110. If the thicknesses of the first light-shielding sub-portion 1322 and the second light-shielding sub-portions 1323 are too large, when the first light-shielding sub-portion 1322 and the second light-shielding sub-portions 1323 are in contact with the substrate 110, the light-transmitting substrate 131 or the connecting portions 1324 cannot be effectively attached to the light-emitting elements 121. This affects a bonding strength between the package assembly 130 and the light emitting elements 121. At this time, if the light-transmitting substrate 131 or the connecting portions 1324 is/are urged to adhere to the light-emitting elements 121, parts of the package assembly 130 corresponding to the first light-shielding sub-portion 1322 and the second light-shielding sub-portions 1323 will protrude from parts of the package assembly 130 corresponding to the light-emitting elements 121, which affects flatness of the package assembly 130 after being attached. By adjusting the thicknesses of the first light-shielding sub-portion 1322 and the second light-shielding sub-portions 1323, a bonding strength and bonding flatness of the package assembly 130 when assembled to the substrate 110 are adjusted to improve a packaging effect of the package assembly 130.

Each of the second light-shielding sub-portions 1323 is located between two adjacent light-emitting elements 121 in one light-emitting unit 120. The first light-shielding sub-portion 1322 is not only located between two adjacent light-emitting units 120, but also surrounds an edge of the surface of the substrate 110 facing the light-emitting elements 121. Setting the thickness of the first light-shielding sub-portion 1322 to be greater than the thickness of the second light-shielding sub-portions 1323 can ensure that when the light-transmitting substrate 131 and the light-emitting elements 121 are bonded together, a part of the first light-shielding sub-portion 1322 located at an edge of the substrate 110 is effectively attached to the substrate 110, so as to effectively encapsulate the light-emitting elements 121 on the substrate 110. At the same time, this structural design can also reduce the second light-shielding sub-portions 1323, so as to reduce fabrication cost of the light-shielding layer 132.

Optionally, the thickness of the first light-shielding sub-portion 1322 is less than or equal to 100 microns. When the package assembly 130 is assembled to the substrate 110, the light-transmitting substrate 131 is attached to the surfaces of the light-emitting elements 121 away from the substrate 110. Therefore, a surface of the first light-shielding sub-portion 1322 facing the light-transmitting substrate 131 needs to be flush with the surfaces of the light-emitting elements 121 facing the light-transmitting substrate 131 to ensure a bonding effect between the package assembly 130 and the light-emitting elements 121. If the thickness of the first light-shielding sub-portion 1322 is too large, when the first light-shielding sub-portion 1322 is in contact with the substrate 110 during a bonding process of the package assembly 130, the light-transmitting substrate 131 has not yet been in contact with the light-emitting elements 121. As a result, a bonding effect between the light-transmitting substrate 131 and the light-emitting elements 121 is poor, which affects stability of the package assembly 130 and the substrate 110.

In an actual manufacturing process, the thickness of the first light-shielding sub-portion 1322 may be 20 microns, 50 microns, 80 microns, 100 microns, or the like. A specific value of the thickness of the first light-shielding sub-portion 1322 can be adjusted according to a thickness of the light-emitting elements 121, which is not limited herein, as long as the light-transmitting substrate 131 and the light-emitting elements 121 are effectively bonded.

Optionally, the thickness of the second light-shielding sub-portions 1323 is less than or equal to 100 microns. Similarly, when the package assembly 130 is assembled to the substrate 110, the light-transmitting substrate 131 needs to be attached to the surfaces of the light-emitting elements 121 away from the substrate 110, and surfaces of the second light-shielding sub-portions 1323 facing the light-transmitting substrate 131 need to be flush with the surfaces of the light-emitting elements 121 facing the light-transmitting substrate 131. If the thickness of the second light-shielding sub-portions 1323 is too large, when the second light-shielding sub-portions 1323 are in contact with the substrate 110 during the bonding process of the package assembly 130, the light-transmitting substrate 131 has not yet been in contact with the light-emitting elements 121. As a result, the bonding effect between the light-transmitting substrate 131 and the light-emitting elements 121 is poor, which affects the stability of the package assembly 130 and the substrate 110.

In addition, the thickness of the first light-shielding sub-portion 1322 is greater than or equal to the thickness of the second light-shielding sub-portions 1323. If the thickness of the second light-shielding sub-portions 1323 is too large, when the second light-shielding sub-portions 1323 are in contact with the substrate 110, the light-transmitting substrate 131 has not yet been in contact with the light-emitting elements 121. At this time, if the light-transmitting substrate 131 is urged to adhere to the light-emitting elements 121, parts of the package assembly 130 corresponding to the first light-shielding sub-portion 1322 and the second light-shielding sub-portions 1323 will protrude from parts of the package assembly 130 corresponding to the light-emitting elements 121, and the part of the package assembly 130 corresponding to the first light-shielding sub-portion 1322 will protrude more. Therefore, in a process of attaching the light-transmitting substrate 131 to the light-emitting elements 121, the first light-shielding sub-portion 1322 is at risk of being lifted. As a result, the part of the first light-shielding sub-portion 1322 located at the edge of the substrate 110 cannot be effectively attached to the substrate 110, which affects the packaging effect of the package assembly 130.

In an actual manufacturing process, the thickness of the second light-shielding sub-portions 1323 may be 10 microns, 30 microns, 50 microns, 70 microns, 100 microns, or the like. A specific value of the thickness of the second light-shielding sub-portions 1323 can be adjusted according to the thickness of the light-emitting elements 121 and the thickness of the first light-shielding sub-portion 1322, which is not limited herein, as long as the light-transmitting substrate 131 and the light-emitting elements 121 are effectively bonded, and the first light-shielding sub-portion 1322 and the substrate 110 are effectively bonded.

In some embodiments, as shown in FIG. 2, the surface of the first light-shielding sub-portion 1322 away from the light-transmitting substrate 131 is in contact with the substrate 110. That is, the thickness of the first light-shielding sub-portion 1322 is same as a height of the surface of each of the light-emitting elements 121 away from the substrate 110 relative to the substrate 110. Therefore, when the package assembly 130 is attached to the substrate 110, the first light-shielding sub-portion 1322 can surround the edge of the surface of the substrate 110 facing the light-emitting elements 121, so that all the light-emitting elements 121 on the substrate 110 are surrounded by the first light-shielding sub-portion 1322. This improves the packaging effect of the package assembly 130 on the light-emitting elements 121 and prevents external environment from affecting a light-emitting effect of the light-emitting elements 121.

In other embodiments, as shown in FIG. 1, the surface of the first light-shielding sub-portion 1322 away from the light-transmitting substrate 131 is in contact with the substrate 110, and the surface of each of the second light-shielding sub-portions 1323 away from the light-transmitting substrate 131 is in contact with the substrate 110. That is, the thickness of the first light-shielding sub-portion 1322 and the thickness of the second light-shielding sub-portions 1323 are the same. This structural design ensures a surface flatness of the light-transmitting substrate 131 and increases a contact area between the package assembly 130 and the substrate 110 when the package assembly 130 is attached to the substrate 110, thereby enhancing a structural stability of the package assembly 130 and the substrate 110.

It should be noted that the package assembly 130 may be attached to the substrate 110 by bonding or vacuum suction. When bonding is used, an adhesive layer needs to be coated on a surface of the package assembly 130 facing the substrate 110. At this time, if the thicknesses of the first light-shielding sub-portion 1322 and the second light-shielding sub-portions 1323 are the same, the adhesive layer may be coated on the first light-shielding sub-portion 1322 and the second light-shielding sub-portions 1323 at the same time, so as to enhance a bonding strength between the package assembly 130 and the substrate 110. If the thickness of the second light-shielding sub-portions 1323 is less than the thickness of the first light-shielding sub-portion 1322, the adhesive layer may only be coated on the first light-shielding sub-portion 1322. The thickness of the second light-shielding sub-portions 1323 may be adjusted according to design requirements, so that a structure design of the light-shielding layer 132 is more flexible.

When vacuum suction is used, it is only necessary to perform vacuuming during the bonding process, so that the light-transmitting substrate 131 or the connecting portions 1324 is/are adsorbed on the surfaces of the light-emitting elements 121 away from the substrate 110, and the first light-shielding sub-portion 1322 and the second light-shielding sub-portions 1323 are adsorbed on the substrate 110. At this time, if the thicknesses of the first light-shielding sub-portion 1322 and the second light-shielding sub-portions 1323 are the same, the surface of the light-transmitting substrate 131 away from the substrate 110 after vacuum suction is kept flat.

If the thickness of the second light-shielding sub-portions 1323 is less than the thickness of the first light-shielding sub-portion 1322, because the light-transmitting substrate 131 is a flexible substrate, after vacuum suction, parts of the light-transmitting substrate 131 corresponding to the second parts of the light-transmitting substrate 1311323 may be dented. However, due to small size, an impact of these dentes is negligible. In addition, vacuum suction is used so that when the package assembly 130 is uncovered to repair the light-emitting elements 121, no adhesive substance remains on the light-emitting elements 121, so as to ensure normal operation of the light-emitting elements 121 after being repeatedly bonded and uncovered.

Optionally, there is a first gap between the first light-shielding sub-portion 1322 and the adjacent light-emitting unit 120. That is, there is a first gap between the first light-shielding sub-portion 1322 and one light-emitting element 121 of the adjacent light-emitting unit 120 that is close to the first light-shielding sub-portion 1322. In this structural design, a light emitted from a side of the light-emitting element 121 is still blocked by the first light-shielding sub-portion 1322, so as to avoid mutual interference between two adjacent light-emitting units 120. At the same time, the first gap enables the first light-shielding sub-portion 1322 to be smoothly inserted between the two adjacent light-emitting units 120 when the package assembly 130 is attached to the substrate 110.

Similarly, there is a second gap between each of the second light-shielding sub-portions 1323 and the adjacent light-emitting element 121. In this structural design, the light emitted from the side of the light-emitting element 121 is still blocked by the second light-shielding sub-portions 1323, so as to avoid mutual interference between two adjacent light-emitting elements 121 in one same light-emitting units 120. At the same time, the second gap enables the second light-shielding sub-portions 1323 to be smoothly inserted between the two adjacent light-emitting elements 121 in the same light-emitting units 120 when the package assembly 130 is attached to the substrate 110.

It should be noted that in the embodiments of the present disclosure, the light-transmitting substrate 131 is made of a transparent material. When the light-transmitting substrate 131 is directly attached to the surfaces of the light-emitting elements 121 away from the substrate 110, using a transparent material to make the light-transmitting substrate 131 makes observation of the light-emitting elements 121 more intuitive. This facilitates quicker confirmation of locations of the light emitting elements 121 that are failed, thereby improving a repair efficiency of the light emitting elements 121.

Optionally, the package assembly 130 comprises a plurality of the light-transmitting substrates 131 stacked on each other, and two adjacent light-transmitting substrates 131 have different refractive indices. In a process of designing the package assembly 130, it is necessary to consider an influence of the package assembly 130 on the light-emitting rate of the light-emitting panel 100, as well as an influence of the package assembly 130 on a light-emitting angle of the light-emitting panel 100. By disposing a plurality of the light-transmitting substrates 131 and making the refractive indices of two adjacent light-transmitting substrates 131 different, an outgoing angle of the light emitted by the light-emitting elements 121 can be changed when passing through the two adjacent light-transmitting substrates 131, so as to adjust a final light-emitting angle of the light-emitting elements 121.

In some embodiments, the light-transmitting substrates 131 have different refractive indices. That is, the refractive indices of the light-transmitting substrates 131 are different from each other. The refractive indices of the light-transmitting substrates 131 increase sequentially in the direction away from the light-shielding layer 132, or the refractive indices of the light-transmitting substrates 131 decrease sequentially in the direction away from the light-shielding layer 132. Its specific design may be adjusted according to actual application requirements, and no specific restrictions are made herein. By adjusting the refractive indices of the light-transmitting substrates 131, requirements of different light-emitting angles of the light-emitting panel 100 can be met.

It should be noted that in the embodiments of the present disclosure, the light-emitting panel 100 may be directly used as a direct display panel, and the light-emitting elements 121 in the light-emitting panel 100 serve as a display light source. Alternatively, the light-emitting panel 100 is used as a backlight panel, and the light-emitting elements 121 in the light-emitting panel 100 are used as a backlight source. A structure and specific application scenario of the light-emitting panel 100 may be adjusted according to actual design and usage requirements, which are not particularly limited herein.

The present disclosure further provides a display device. The display device comprises a light-emitting panel. A specific structure of the light-emitting panel refers to the aforementioned embodiments. Because the display device adopts all technical solutions of the aforementioned embodiments, it has at least all beneficial effects brought by the technical solutions of the aforementioned embodiments, which will not be described in detail herein.

Figure 4:
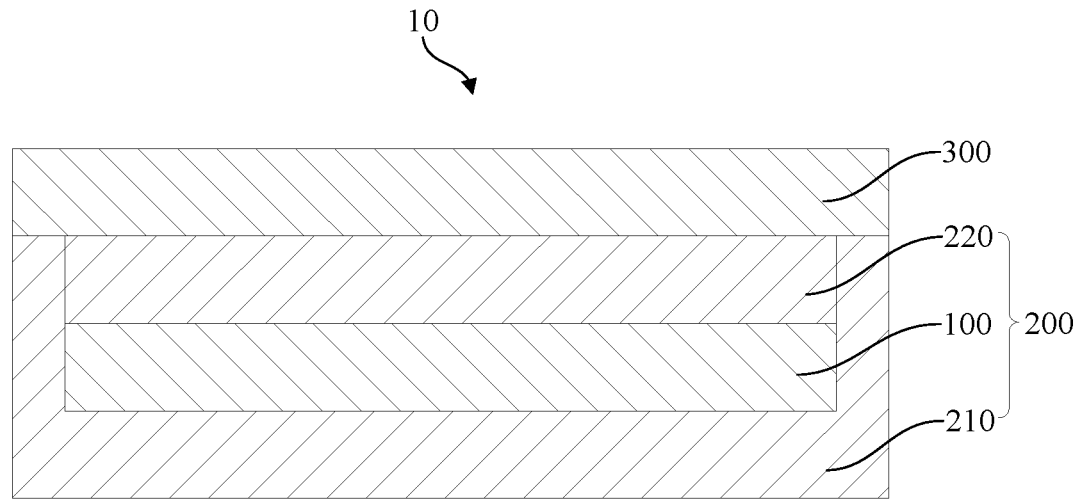
FIG. 4 is a schematic structural diagram of a display device according to an embodiment of the present disclosure.

As shown in FIG. 4, the light-emitting panel 100 is used as a backlight panel. A display device 10 comprises a backlight module 200 and a display panel 300. The display panel 300 is disposed on a light-emitting surface of the backlight module 200. The backlight module 200 comprises a backplane 210, the light-emitting panel 100, and an optical film set 220. The light-emitting panel 100 is disposed on the backplane 210. The optical film set 220 is stacked on the light-emitting panel 100. A plurality of the light-emitting panels 100 that are spliced together may be disposed on the backplane 210, so as to prevent an area of one light-emitting panel 100 from being too large, thereby reducing difficulty of a manufacturing process.

It should be noted that the backplane 210 may be provided with a positioning groove, and the light-emitting panel 100 and the optical film set 220 are disposed in the positioning groove. The positioning groove is used to limit positions of the backplane 210 and the optical film set 220, so as to facilitate assembly of the backlight module 200.

As shown in FIG. 5, the light-emitting panel 100 is used as a direct display panel. A display device 10 comprises the light-emitting panel 100, a control circuit 400, and a housing 500. The housing 500 is connected to the light-emitting panel 100 to support and fix the light-emitting panel 100. The control circuit 400 is disposed in the housing 500. The control circuit 400 is electrically connected to the light-emitting panel 100 to control the light-emitting panel 100 to display an image.

The light-emitting panel 100 may be fixed to the housing 500 to form a whole with the housing 500. The light-emitting panel 100 and the housing 500 form a closed space for accommodating the control circuit 400. The control circuit 400 may be used as a main board of the display device 10. At the same time, the control circuit 400 may be integrated with one or more functional components such as a battery, an antenna structure, a microphone, a speaker, an earphone jack, a universal serial bus interface, a camera, a distance sensor, an ambient light sensor, and a processor, so that the display device 10 is suitable for various application fields.

The display device 10 in the embodiments of the present disclosure has a wide range of applications, including televisions, computers, mobile phones, flexible displays such as foldable and bendable display screens, illumination, and wearable devices such as smart bracelets and smart watches, which all fall within an application scope of the display device 10 in the embodiments of the present disclosure.

Finally, the present disclosure further provides a method for fabricating a light-emitting panel. Using this method, the light-emitting panel described in the above embodiments can be fabricated. As shown in FIG. 6, the method for fabricating the light-emitting panel mainly comprises the following steps.

S100: providing a substrate 110.

When fabricating the light-emitting panel 100, the substrate 110 needs to be provided first. The substrate 110 is configured as a supporting structure of the light-emitting panel 100 to support other structures in the light-emitting panel 100, so as to ensure a structural stability of the light-emitting panel 100. The substrate 110 is provided with a control device and a driving circuit to control other structures subsequently disposed on the substrate 110, so as to regulate a light-emitting effect of the light-emitting panel 100.

S200: transferring a light-emitting element 121 to the substrate 110, so that the light-emitting element 121 is electrically connected to the substrate 110.

When fabricating the light-emitting panel 100, the light-emitting element 121 is an independently fabricated device. After the control device and the driving circuit are formed in the substrate 110, a layer of solder paste needs to be printed on a target area of a surface of the substrate 110. Then, the light-emitting element 121 is transferred, so that the light-emitting element 121 is adhered on the solder paste, and is electrically connected to the control device in the substrate 110 through the solder paste, so as to control a light-emitting mode of the light-emitting element 121.

S300: providing a package assembly 130, wherein the package assembly 130 comprises a light-transmitting substrate 131 and a light-shielding layer 132 stacked on each other, the light-shielding layer 132 comprises a plurality of light-shielding portions 1321 arranged at intervals, one end of each of the light-shielding portions 1321 facing the light-transmitting substrate 131 is connected to the light-transmitting substrate 131, and two adjacent light-shielding portions 1321 and the light-transmitting substrate 131 form an accommodation space 133.

When the light-emitting element 121 is transferred to the substrate 110, the package assembly 130 can be fabricated in advance or simultaneously. That is, the package assembly 130 is also independently fabricated, and its fabrication process is independent of a transfer process of the light-emitting element 121, and will not cause mutual interference, which helps to improve fabrication efficiency of the light-emitting panel 100.

The package assembly 130 comprises the light-transmitting substrate 131 and the light-shielding layer 132 stacked on each other. The light-shielding layer 132 comprises the light-shielding portions 1321 arranged at intervals. One end of each of the light-shielding portions 1321 facing the light-transmitting substrate 131 is connected to the light-transmitting substrate 131. Two adjacent light-shielding portions 1321 and the light-transmitting substrate 131 form one accommodation space 133. The light-shielding layer 132 is configured to shield an ambient light reflected by a non-display area of the substrate 110, so as to prevent the reflected ambient light from interfering with a light emitted from the light-emitting panel 100 and affecting the light-emitting effect of the light-emitting panel 100. The light-transmitting substrate 131 is configured to allow a light emitted by the light-emitting element 121 to pass through the package assembly 130, so as to ensure a light-extraction rate of the light-emitting panel 100.

S400: assembling the package assembly 130 to the substrate 110, so that the light-emitting element 121 is located in the accommodating space 133, and a light emitted by the light-emitting element 121 pass through the package assembly 130.

After the light-emitting element 121 is transferred, the fabricated package assembly 130 is assembled to the substrate 110, so that the light-emitting element 121 is located in the accommodating space 133. That is, the light-shielding layer 132 is located between the light-transmitting substrate 131 and the substrate 110. An entirety of the package assembly 130 is assembled to the substrate 110, so as to realize packaging of the light-emitting element 121. In this way, when the light emitting element 121 fails, the entirety of the package assembly 130 can be uncovered to expose the light emitting element 121, so as to facilitate inspection and repair of the light emitting element 121, thereby ensuring continued use of the light emitting panel 100.

In addition, by disposing the light-emitting element 121 in the accommodating space 133 formed by the light-shielding portions 1321 and the light-transmitting substrate 131, a thickness of a part of the light-shielding layer 132 corresponding to a light-emitting surface of the light-emitting element 121 is less than thicknesses of other parts of the light-shielding layer 132. Therefore, a light emitted by the light emitting element 121 can more easily pass through the package assembly 130, so as to improve the light-extraction rate of the light emitting panel 100.

Optionally, as shown in FIG. 7, in this embodiment, a specific method for manufacturing the package assembly 130 involved in step S300 and a process of assembling the package assembly 130 and the substrate 110 involved in S400 mainly comprise the following steps.

S310: providing the light-transmitting substrate 131.

When manufacturing the package assembly 130, the light-transmitting substrate 131 needs to be provided first, and operations such as cleaning and drying a surface of the light-transmitting substrate 131 are performed to facilitate subsequent film formation. The light-transmitting substrate 131 has good flexibility, so as to facilitate bonding and opening of the package assembly 130, and avoid creases on the surface of the light-transmitting substrate 131 during the bonding and opening, which will affect a light-transmitting effect of the light-transmitting substrate 131 or a light-emitting effect of the light-emitting panel 100.

In addition, the light-transmitting substrate 131 may be directly made of a transparent material, such as polyethylene terephthalate (PET), polyethylene naphthalate (PEN), or polyimide (PI), which makes observation of the light emitting element 121 more intuitive, so that a location of the light emitting element 121 that is failed can be confirmed more quickly, thereby improving a repair efficiency of the light emitting element 121.

S320: coating the light-shielding layer 132 on the light-transmitting substrate 131.

As shown in FIG. 8, after the light-transmitting substrate 131 is cleaned, the light-shielding layer 132 is coated on the light-transmitting substrate 131. A coating thickness of the light shielding layer 132 may be adjusted according to a height of a surface of the light-emitting element 121 away from the substrate 110 relative to the substrate 110, so as to effectively encapsulate the light emitting element 121 when the package assembly 130 is attached.

The light-shielding layer 132 may be made of a black oil or other light-shielding materials with a certain light-shielding effect. A light-shielding effect of the light-shielding layer 132 may be adjusted according to a thickness of the light-shielding layer 132, so as to meet design requirements of the light-shielding layer 132 with different structures.

S330: processing the light-shielding layer 132 to form the light-shielding portions 1321 arranged at intervals, so that one end of each of the light-shielding portions 1321 facing the light-transmitting substrate 131 is connected to the light-transmitting substrate 131, two adjacent light-shielding portions 1321 and the light-transmitting substrate 131 form one accommodation space 133, and the light-shielding layer 132 and the light-transmitting substrate 131 form the package assembly 130.

Figure 9:
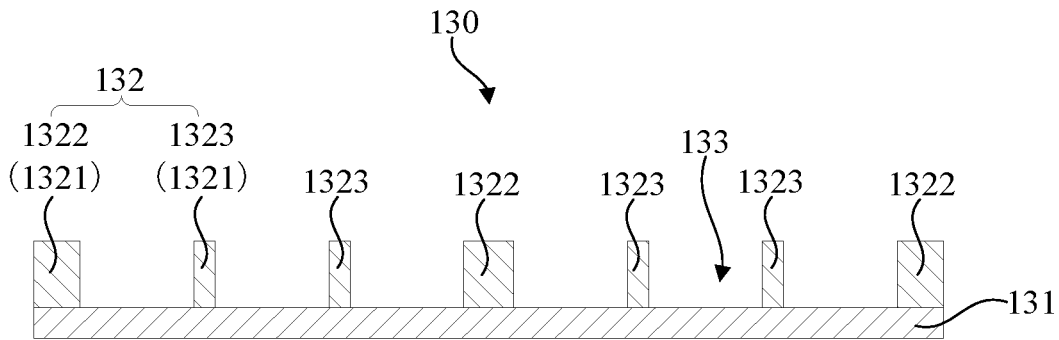
FIG. 9 is a schematic structural diagram of step S330 of FIG. 7 according to an embodiment of the present disclosure.

As shown in FIG. 9 and FIG. 10, after the light-shielding layer 132 is coated, the light shielding layer 132 needs to be processed to form the light-shielding portions 1321 arranged at intervals, and a part of the light-transmitting substrate 131 between two adjacent light-shielding portions 1321 is exposed.

Specifically, when the light shielding layer 132 is processed, the light shielding layer 132 is first exposed, and a mask is used to shield target areas where the accommodation spaces 133 are located. Then, the light-shielding layer 132 is developed to dissolve an unirradiated area of the light-shielding layer 132 in a developing solution for removal, thereby forming the light-shielding portions 1321 and the accommodating spaces 133 arranged at intervals.

It should be noted that the thickness of the light shielding layer 132 may be adjusted according to a corresponding exposure amount. The greater the exposure amount received by the light shielding layer 132, the greater the thickness of the corresponding part of the light shielding layer 132 after development. Conversely, the less the exposure amount received by the light shielding layer 132, the less the thickness of the corresponding part of the light shielding layer 132 after development.

S340: assembling the package assembly 130 to the substrate 110, so that the light-emitting element 121 is located in the accommodating space 133, and a surface of the light-emitting element 121 away from the substrate 110 is connected to the light-transmitting substrate 131.

After the package assembly 130 is fabricated, the package assembly 130 needs to be assembled to the substrate 110, so that the light-emitting element 121 is located in the accommodating space 133, and the surface of the light-emitting element 121 away from the substrate 110 is connected to the light-transmitting substrate 131. This structural design enables the light emitted by the light-emitting element 121 to only pass through the light-transmitting substrate 131, thereby further improving the light-extraction rate of the light-emitting panel 100.

In some embodiments, after the light-transmitting substrate 131 is provided and the light-shielding layer 132 is coated on the light-transmitting substrate 131, the light-shielding layer 132 is processed to form the light-shielding portions 1321 arranged at intervals and a plurality of connecting portions 1324 each connected between two adjacent light-shielding portions 1321. One end of each of the light-shielding portions 1321 facing the light-transmitting substrate 131 is connected to the light-transmitting substrate 131, a surface of each of the connecting portions 1324 facing the light-transmitting substrate 131 is connected to the light-transmitting substrate 131, and one accommodating space 131 is formed by two adjacent light-shielding portions 1321 and one corresponding connecting portion 1324.

That is, the light-shielding layer 132 is disposed on an entire surface of the light-transmitting substrate 131, and a thickness of the connecting portion 1324 corresponding to the light-emitting element 121 is less than the thicknesses of the other parts of the light-shielding layer 132. This structural design can ensure structural integrity of the light shielding layer 132 while ensuring that an entirety of the light-emitting panel 100 has a certain light-extraction rate.

Furthermore, when the package assembly 130 is assembled to the substrate 110, the light-emitting element 121 is located in the accommodating space 133, and the surface of the light-emitting element 121 away from the substrate 110 is connected to the connecting portion 1324, so that the light emitted by the light-emitting element 121 can pass through the light-transmitting substrate 131. This structural design enables each area of the light-shielding layer 132 to interact with each other when the package assembly 130 is uncovered. This reduces a risk that parts of the light-shielding portions 1321 are left on the substrate 110 due to an excessive bonding strength between the light-shielding layer 132 and the substrate 110, thereby improving a structural stability of the package assembly 130. A thickness of the connecting portions 1324 may be adjusted according to actual application requirements, so as to meet design requirements of the light-emitting panel 100 with different light-extraction rates.

Optionally, in this embodiment, the light-emitting panel 100 further comprises a plurality of light-emitting units 120. Each of the light-emitting units 120 comprises a plurality of the light-emitting elements 121. The light-shielding portions 1321 comprise a first light-shielding sub-portion 1322 and a plurality of second light-shielding sub-portions 1323. That is, the light-emitting elements 121 transferred onto the substrate 110 are divided into the light-emitting units 120. And, when the light-shielding layer 132 is exposed and developed, the light-shielding portions 1321 are divided into the first light-shielding sub-portion 1322 and the second light-shielding sub-portions 1323. Specific structures of the first light-shielding sub-portion 1322 and the second light-shielding sub-portions 1323 and their arrangement relationship with the light-emitting units 120 and the light-emitting elements 121 can be referred to relevant description of the light-emitting panel 100 in the aforementioned embodiments, which will not be described in detail herein.

Specifically, when the package assembly 130 is assembled to the substrate 110, the first light-shielding sub-portion 1322 is located between two adjacent light-emitting units 120, and each of the second light-shielding sub-portions 1323 is located between two adjacent light-emitting elements 121 in one light-emitting unit 120. That is, the first light-shielding sub-portion 1322 is mainly used to shield light between the light-emitting units 120, so as to avoid mutual interference between two adjacent light-emitting units 120. The second light-shielding sub-portions 1323 are mainly used to shield light between two adjacent light-emitting elements 121 in one light-emitting unit 120, so as to avoid mutual interference between two adjacent light-emitting elements 121 in one light-emitting unit 120.

It should be noted that a thickness of the first light-shielding sub-portion 1322 and a thickness of the second light-shielding sub-portions 1323 may also be individually adjusted according to exposure amounts received by the first light-shielding sub-portion 1322 and the second light-shielding sub-portions 1323, so as to meet different structural design requirements of the first light-shielding sub-portion 1322 and the second light-shielding sub-portions, thereby expanding a use range of the package assembly 130.

The device, the method, and the display device for transferring micro light-emitting diodes provided by the embodiments of the present disclosure are described in detail above. The present disclosure uses specific examples to describe principles and embodiments of the present invention. The above description of the embodiments is only for helping to understand the solutions of the present invention and its core ideas. Furthermore, those skilled in the art may make modifications to the specific embodiments and applications according to ideas of the present invention. In conclusion, the present specification should not be construed as a limitation to the present invention.

What is claimed is:

1. A light-emitting panel, comprising:
   a substrate;
   a light-emitting element disposed on the substrate and electrically connected to the substrate; and
   a package assembly disposed on the substrate and comprising a light-transmitting substrate and a light-shielding layer stacked on each other, wherein the light-shielding layer is located between the light-transmitting substrate and the substrate and comprises a plurality of light-shielding portions arranged at intervals, one end of each of the light-shielding portions away from the substrate is connected to the light-transmitting substrate, two adjacent light-shielding portions and the light-transmitting substrate form an accommodation space, and the light-emitting element is located in the accommodating space, so that a light emitted by the light-emitting element pass through the package assembly, wherein the package assembly comprises a plurality of the light-transmitting substrates stacked on each other, and refractive indices of the light-transmitting substrates increase sequentially in the direction away from the light-shielding layer.

2. The light-emitting panel according to claim 1, wherein a surface of the light-emitting element away from the substrate is connected to the light-transmitting substrate.

3. The light-emitting panel according to claim 1, wherein the light-shielding layer further comprises a plurality of connecting portions each connected between two adjacent light-shielding portions, a surface of each of the connecting portions facing the light-transmitting substrate is connected to the light-transmitting substrate, one accommodating space is formed by two adjacent light-shielding portions and one corresponding connecting portion, and a surface of the light-emitting element away from the substrate is connected to the connecting portion.

4. The light-emitting panel according to claim 1, further comprising a plurality of light-emitting units, wherein each of the light-emitting units comprises a plurality of the light-emitting elements, the light-shielding portions comprises a first light-shielding sub-portion, one end of the first light-shielding sub-portion away from the substrate is connected to the light-transmitting substrate, and the first light-shielding sub-portion is disposed around each of the light-emitting units.

5. The light-emitting panel according to claim 4, wherein the light-shielding portions comprise a plurality of second light-shielding sub-portions, one end of each of the second light-shielding sub-portions away from the substrate is connected to the light-transmitting substrate, and each of the second light-shielding sub-portions is disposed between two adjacent light-emitting elements in one light-emitting unit.

6. The light-emitting panel according to claim 5, wherein two ends of each of the second light-shielding sub-portions between two adjacent light-emitting elements in one light-emitting unit are respectively connected with two parts of the first light-shielding sub-portion located on opposite sides of the corresponding light-emitting unit.

7. The light-emitting panel according to claim 5, wherein a thickness of the first light-shielding sub-portion is greater than or equal to a thickness of the second light-shielding sub-portions, the thickness of the first light-shielding sub-portion is less than or equal to 100 microns, and the thickness of the second light-shielding sub-portions is less than or equal to 100 microns.

8. The light-emitting panel according to claim 7, wherein a surface of the first light-shielding sub-portion away from the light-transmitting substrate is in contact with the substrate.

9. The light-emitting panel according to claim 7, wherein a surface of the first light-shielding sub-portion away from the light-transmitting substrate is in contact with the substrate, and a surface of each of the second light-shielding sub-portions away from the light-transmitting substrate is in contact with the substrate.

10. The light-emitting panel according to claim 4, wherein there is a first gap between the first light-shielding sub-portion and the adjacent light-emitting unit.

11. The light-emitting panel according to claim 5, wherein there is a second gap between each of the second light-shielding sub-portions and the adjacent light-emitting element.

12. A display device, comprising the light-emitting panel according to claim 1.

13. A light-emitting panel, comprising:

a substrate;

a light-emitting element disposed on the substrate and electrically connected to the substrate; and a package assembly disposed on the substrate and comprising a light-transmitting substrate and a light-shielding layer stacked on each other, wherein the light-shielding layer is located between the light-transmitting substrate and the substrate and comprises a plurality of light-shielding portions arranged at intervals, one end of each of the light-shielding portions away from the substrate is connected to the light-transmitting substrate, two adjacent light-shielding portions and the light-transmitting substrate form an accommodation space, and the light-emitting element is located in the accommodating space, so that a light emitted by the light-emitting element pass through the package assembly, wherein the package assembly comprises a plurality of the light-transmitting substrates stacked on each other, and refractive indices of the light-transmitting substrates decrease sequentially in the direction away from the light-shielding layer.

14. A method for fabricating a light-emitting panel, comprising:

providing a substrate;

transferring a light-emitting element to the substrate, so that the light-emitting element is electrically connected to the substrate;

providing a package assembly, wherein the package assembly comprises a light-transmitting substrate and a light-shielding layer stacked on each other, the light-shielding layer comprises a plurality of light-shielding portions arranged at intervals, one end of each of the light-shielding portions facing the light-transmitting substrate is connected to the light-transmitting substrate, and two adjacent light-shielding portions and the light-transmitting substrate form an accommodation space; and assembling the package assembly to the substrate, so that the light-emitting element is located in the accommodating space, and a light emitted by the light-emitting element pass through the package assembly, wherein the package assembly comprises a plurality of the light-transmitting substrates stacked on each other, and refractive indices of the light-transmitting substrates increase sequentially in the direction away from the light-shielding layer.

15. The method for fabricating the light-emitting panel according to claim 14, wherein the providing the package assembly and the assembling the package assembly to the substrate comprise:

providing the light-transmitting substrate;

coating the light-shielding layer on the light-transmitting substrate;

processing the light-shielding layer to form the light-shielding portions arranged at intervals, so that one end of each of the light-shielding portions facing the light-transmitting substrate is connected to the light-transmitting substrate, two adjacent light-shielding portions and the light-transmitting substrate form one accommodation space, and the light-shielding layer and the light-transmitting substrate form the package assembly; and assembling the package assembly to the substrate, so that the light-emitting element is located in the accommodating space, and a surface of the light-emitting element away from the substrate is connected to the light-transmitting substrate.

16. The method for fabricating the light-emitting panel according to claim 14, wherein the providing the package assembly and the assembling the package assembly to the substrate comprise:

providing the light-transmitting substrate;

coating the light-shielding layer on the light-transmitting substrate;

processing the light-shielding layer to form the light-shielding portions arranged at intervals and a plurality of connecting portions each connected between two adjacent light-shielding portions, so that one end of each of the light-shielding portions facing the light-transmitting substrate is connected to the light-transmitting substrate, a surface of each of the connecting portions facing the light-transmitting substrate is connected to the light-transmitting substrate, one accommodating space is formed by two adjacent light-shielding portions and one corresponding connecting portion, and the light-shielding layer and the light-transmitting substrate form the package assembly; and assembling the package assembly to the substrate, so that the light-emitting element is located in the accommodating space, and a surface of the light-emitting element away from the substrate is connected to the connecting portion.

17. The method for fabricating the light-emitting panel according to claim 14, wherein the light-emitting panel comprises a plurality of light-emitting units, each of the light-emitting units comprises a plurality of the light-emitting elements, the light-shielding portions comprise a first light-shielding sub-portion and a plurality of second light-shielding sub-portions, and the assembling the package assembly to the substrate comprises:

assembling the package assembly to the substrate, so that the first light-shielding sub-portion is located between two adjacent light-emitting units, and each of the second light-shielding sub-portions is disposed between two adjacent light-emitting elements in one light-emitting unit.

18. A method for fabricating a light-emitting panel, comprising:

providing a substrate;

transferring a light-emitting element to the substrate, so that the light-emitting element is electrically connected to the substrate;

providing a package assembly, wherein the package assembly comprises a light-transmitting substrate and a light-shielding layer stacked on each other, the light-shielding layer comprises a plurality of light-shielding portions arranged at intervals, one end of each of the light-shielding portions facing the light-transmitting substrate is connected to the light-transmitting substrate, and two adjacent light-shielding portions and the light-transmitting substrate form an accommodation space; and assembling the package assembly to the substrate, so that the light-emitting element is located in the accommodating space, and a light emitted by the light-emitting element pass through the package assembly, wherein the package assembly comprises a plurality of the light-transmitting substrates stacked on each other, and refractive indices of the light-transmitting substrates decrease sequentially in the direction away from the light-shielding layer.

* * * * *